Figure 1:
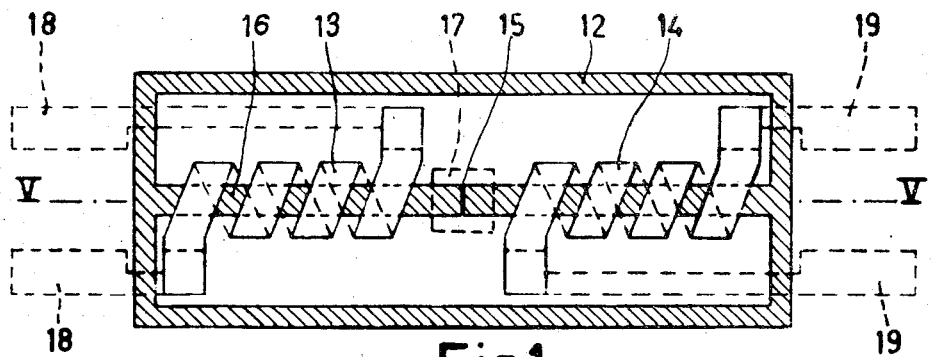
Figure 2:
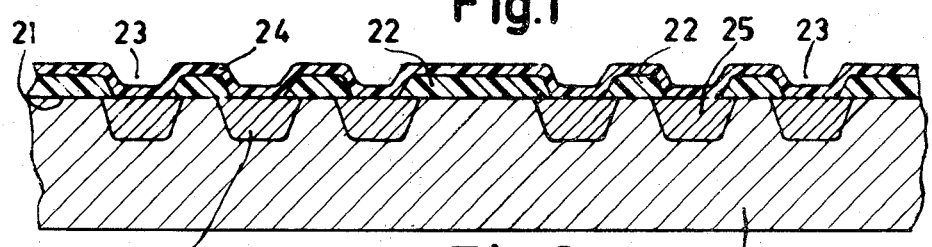

United States Patent [19]
Bertens et al.

[11] 3,968,565
[45] July 13, 1976

[54] METHOD OF MANUFACTURING A DEVICE COMPRISING A SEMICONDUCTOR BODY

[75] Inventors: Theodorus Cornelius Johannes Maria Bertens; Hendrikus Josephus Antonius Van Dijk; Jan T. Gerkema, all of Eindhoven, Netherlands

[73] Assignee: U.S. Philips Corporation, New York, N.Y.

[22] Filed: Jan. 9, 1975

[21] Appl. No.: 539,784

Related U.S. Application Data

[63] Continuation of Ser. No. 392,791, Aug. 29, 1973, abandoned.

[30] Foreign Application Priority Data

Sept. 1, 1972  Netherlands........................ 7211910

[52] U.S. Cl.................................... 29/603; 29/580; 29/591; 204/129.3; 204/129.35
[51] Int. Cl.².......................... G11B 5/42; H01F 7/06
[58] Field of Search............ 29/580, 591, 602, 625, 29/603; 204/129.3, 129.35

[56] References Cited
UNITED STATES PATENTS

| | | | |
|---|---|---|---|
| 3,661,741 | 5/1972 | Meek............................... | 204/129.3 |
| 3,713,922 | 1/1973 | Lepselter......................... | 204/129.3 |
| 3,881,244 | 5/1975 | Kendall............................ | 29/602 |

*Primary Examiner*—W. Tupman
*Attorney, Agent, or Firm*—Frank R. Trifari; Jack Oisher

[57] ABSTRACT

The invention relates to a method of manufacturing a device, for example, a magnetic head for recording and playing back information on a magnetisable medium.

In this method, a substrate of semiconductor material is profiled by a selective electrolytic etching process.

Preceding the etching process, the part of the substrate to be removed by said process is formed by a local doping treatment, for example, by diffusion.

The doping treatment may be carried out in several overlapping steps.

5 Claims, 5 Drawing Figures

METHOD OF MANUFACTURING A DEVICE COMPRISING A SEMICONDUCTOR BODY

This is a continuation of application Ser. No. 392,791, filed Aug. 29, 1973, now abandoned.

The invention relates to a method of manufacturing a device comprising a semiconductor body, in which a part of a surface of the semiconductor body is subjected to a selective electrolytic etching process by which a zone of the semiconductor body which adjoins the part of the surface and the thickness of which is determined by the difference in conductivity properties between the zone and the deeper located semiconductor material is removed. The invention furthermore relates to a device manufactured by means of the method.

In such a selective electrolytic etching process, for example, semiconductor material of the p-conductivity type is selectively removed with respect to that of the n-conductivity type, or also more strongly doped semiconductor material of a given conductivity type is selectively removed with respect to less strongly doped semiconductor material of the same conductivity type.

A method of the type mentioned in the preamble is known from the U.S. Pat. No. 3,418,226. In this method, an etchant-resistant masking layer is provided on a semiconductor body which has conductivity properties varying in the direction of thickness, said layer leaving parts of the semiconductor surface to be etched exposed. Said parts are then subjected to a selective electrolytic etching process in which more strongly doped semiconductor material is removed with respect to less strongly doped semiconductor material of the same conductivity type.

The potential of the semiconductor material to be etched serves as a measure of the selectivity and depends inter alia on the doping level of said material.

It has been found that in the known etching process the progress of which in the direction of thickness can be controlled via the potential of the semiconductor body, an accurate profile in the lateral direction is often not obtained but that underetching occurs below the masking layer parallel to the semiconductor surface and sadi underetching is not stopped by the above-described potential control.

The result of this is that the resulting accuracy of the profile is insufficient for many devices.

Nor is it possible in the said method to manufacture more complicated profiles, such as profiles having levels at different depths in the semiconductor body.

For example, in the embodiments of the method of the type mentioned in the preamble to be described hereinafter an accurate and complicated profile has often to be carried out.

According to a usual method, a semiconductor device is manufactured according to the so-called "contour-deposition" process in such manner that recesses are provided in a substrate of a comparatively high-ohmic semiconductor material, after which the recesses are filled epitaxially and circuit elements are formed in the epitaxial semiconductor material and/or in the surrounding part of the substrate after removing either the excessive epitaxial semiconductor material or the excessive part of the substrate.

In the manufacture of another semiconductor device, recesses are etched at the area where a surface of a semiconductor body is to be subjected to a oxidation treatment so as to obtain an oxide layer which is at least partially inset in the semiconductor body.

Besides for the manufacture of semiconductor devices, etching of semiconductor bodies is also used in other fields, for example, in manufacturing targets for camera tubes, in which grooves are etched in a semiconductor disk to obtain mutually separated diode regions to be scanned by an electron beam.

Another example is the manufacture of a magnetic head for recording and playing back information in a magnetizable medium in which a surface of a substrate of semiconductor material is profiled and then provided with magnetically operative material.

It is known to chemically etch such a substrate by means of a photo-etching method for a given period of time and at a given temperature. However, the chemical etching rate varies strongly with the composition and the purity of the crystal (surface) used and in addition with the temperature and the composition of the etching liquid. Moreover, in order to obtain, for example, a stepped profile, etching is to be carried out in several steps with an alignment and exposure step between the etching steps. However, the exposure above a recess in the substrate often results in inaccurate reproduction of the contours desired in the recess.

One of the objects of the invention is to provide a method of manufacturing the described and other devices with which the drawbacks of the described profiling method are avoided at least for the greater part.

It is based on the recognition of the fact that the semiconductor material to be removed can be pretreated by means of a comparatively simple treatment step as a result of which the correct quantity of material is removed in the correct place during the subsequent selective etching step.

Therefore, the method mentioned in the preamble is characterized according to the invention in that, preceding the selective electrolytic etching process, the zone to be removed by said process is formed by means of a local doping treatment as a result of which the conductivity properties of the zone, besides in the direction of thickness, also differ from those of semiconductor material adjoining the zone in directions parallel to the surface.

A diffusion process is preferably used as a local doping treatment. Upon diffusion, a desired concentration profile can be accurately obtained by causing a doping material of a given concentration to diffuse into the semiconductor body, via apertures in a masking layer, for example, from the gaseous phase for a given time and at a given temperature.

Ion implantation, if desired succeeded by a thermal treatment, may also be used to obtain a desired concentration profile.

Since, as a result of the local doping treatment the zone(s) formed is (are) bounded also in directions parallel to the semiconductor surface, the material removal during the selective etching treatment is also restricted in the said directions.

A local doping treatment is preferably used which consists of at least two doping steps which partially overlap each other.

In such a doping treatment a zone having an accurately defined and also complicated, for example, stepped, shape can be formed in the semiconductor body in a comparatively simple manner.

The invention furthermore relates to a device manufactured by means of the method according to the invention.

The invention will be described in greater detail with reference to an embodiment and the accompanying drawing.

Figure 3:
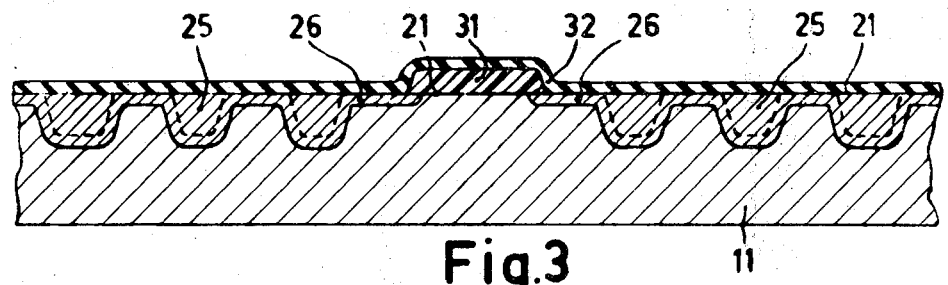
Figure 4:
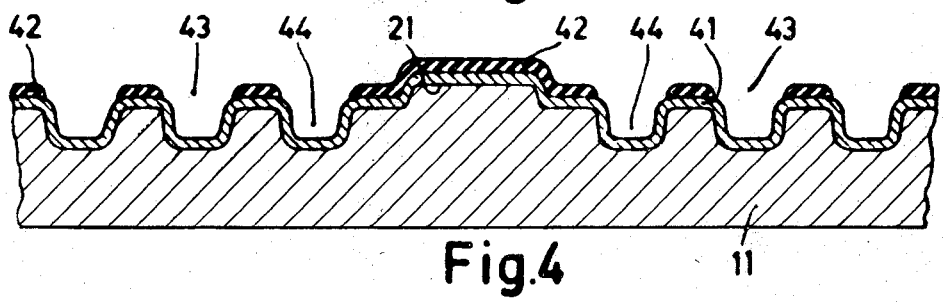
Figure 5:
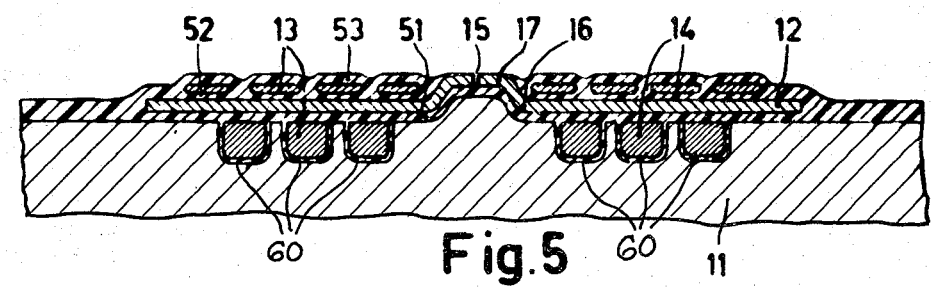

In the drawing, FIG. 1 is a diagrammatic plan view of a device manufactured by means of the method according to the invention, FIGS. 2 to 5 are diagrammatic sectional views of a part of said device in successive stages of manufacture by means of the method according to the invention, FIG. 5 being a cross-sectional view taken on the line V—V in FIG. 1.

The device shown in FIGS. 1 and 5 comprises a semiconductor body 11 as is used in a magnetic head for recording and playing back information in a magnetisable medium.

The information is recorded or played back from a magnetisable medium, not shown, at the area of a gap 15 in a nickel-iron core 12. As a result of a current through windings 13 and 14 isolated from the core 12, an inhomogeneous magnetic field is produced around the gap 15.

In order to protect the magnetic head from detrition upon contact with a magnetisable medium moving past the gap, it is advantageous when the magnetic head itself has a surface which is as smooth as possible. For that purpose it is desirable for the semiconductor body which serves as a carrier of the core 12 and the windings 13 and 14 to have a profiled surface.

The starting material in the manufacture of the semiconductor body is a high-ohmic n-type silicon disk 11 (see FIG. 2) having a resistivity p of from 3 to 5 $\Omega$cm, a diameter of approximately 38 mm and a thickness of 250 $\mu$m.

The profile is obtained by subjecting a part of a surface of the silicon disk to a selective electrolytic etching process. In this process, a zone of the silicon disk adjoining the part of the surface is removed. The thickness of the zone to be removed is determined by the difference in conductivity properties between the zone and the deeper-situated semiconductor material.

According to the invention, the zone to be removed is formed by means of a local doping treatment as a result of which the conductivity properties of the zone, besides in the direction of thickness, also differ from those of silicon adjoining the zone in directions parallel to the surface. In the present example, a diffusion zone is used as a local doping treatment which consists of two steps overlapping each other partially.

In a usual manner, a silicon oxide layer 22 is grown thermally on the surface 21 of the silicon disk 11 and provided with apertures 23 having a dimension of 200 × 300 $\mu$m by means of a photo-etching method.

A phosphate glass layer 24 is provided on the silicon oxide layer and in the apertures by maintaining the disk in the POCl$_3$-stream at 1000°C for 45 minutes.

The disk is then kept at 1200°C for 4½ hours as a result of which 9 $\mu$m deep n$^+$-regions 25 are diffused having a resistivity of approximately 0.03 $\Omega$cm. The layers 22 and 24 are then removed and the described first diffusion step is succeeded by a second diffusion step which overlaps the first diffusion step and which differs from the first in the form of the silicon oxide layer 31 (see FIG. 3), the phosphate glass layer 32 and the duration of the diffusion (one hour instead of 4½ hours).

During the diffusion, the depth of the regions 25 shown in broken lines in FIG. 3 increases from 9 $\mu$m to 10 $\mu$m and the regions form a zone 26 together with the 4 $\mu$m deep regions formed during the second diffusion step.

The layers 31 and 32 are then removed and the surface 21 is subjected in a usual manner to a selective electrolytic etching process in which the zone 26 is removed. The etching process is carried out, for example, in an aqueous solution of 5% HF, in which the silicon disk is given a voltage of +0.5 to 2 volt relative to a platinum electrode. Etching lasts a few minutes. Sometimes the surface obtains a brown colour which can be removed by a short oxidation succeeded by dip etching in HF solution. The roughness of the resulting surface is less than 0.1 $\mu$m. The surface does not show sharp junctions and is very suitable for coating by sputtering. By means of the described diffusion steps, the shape of the zone 26 is accurately determined by the initial concentration of the phosphorus at the surface, the temperature and the duration of the diffusions. The apertures in the oxide layers 22 and 31 are also accurately determined since in the photo-etching method used alignment can always be carried out on a flat surface.

In a usual manner, the profiled surface 21 of the silicon disk 11 shown in FIG. 4 is provided in subsequent processing steps with the windings 13 and 14 and the core 12.

After oxidation of the surface is not shown in FIG. 4 but at 60 in FIG. 5, a 500 A thick chromium-gold layer 41 (FIG. 4) is vapour-deposited on the surface 21 and provided with a photolacquer layer 42 in which apertures 43 are provided which do not cover the lowest recesses 44 in the silicon body 11. The photolacquer layer 42 serves as a mask in the electrolytic filling with copper of the approximately 6 $\mu$m deep recesses 44 as a result of which the lowermost parts of the windings 13 and 14 are formed.

The photolacquer layer 42 is then removed and the free parts of the chromium/gold layer 41 are removed by sputtering. A silicon oxide layer 41 is provided throughout the surface by sputtering. The nickel-iron core 12 is provided on the layer 51 by sputtering and photo-etching. On said core a silicon oxide layer 52 is again provided by sputtering, in which layer apertures are etched through which parts of the lowermost parts of the windings 13 and 14 are exposed on either side of part 16 of the core 12.

The uppermost parts of the windings 13 and 14 are provided by sputtering of chromium/gold and photo-etching. The whole surface, the centre 17 of the part 16 excepted, is covered with a silicon oxide layer 53, which layer has such a thickness that its surface is at the same level as the surface of the centre 17.

The gap 15 is formed in the centre 17 by etching. The windings 13 and 14 are provided with connection conductors 18 and 19, respectively.

The invention is not restricted to the example described. For example, the semiconductor body may be p-type conductive and a p$^+$-type zone be formed during the doping treatment. The use of a semiconductor body as a substrate has the additional advantage that semiconductor circuit elements can be formed in the substrate.

Within the scope of the present invention, the magnetic head may, of course, have a shape differing from that described in the example. In addition to magnetic heads, for example, the already stated targets or semiconductor devices may also be manufactured by means of the method according to the invention.

What is claimed is:

1. A method of manufacturing a film-deposited magnetic head comprising the steps of:
   a. providing a semiconductor body having a flat major surface, said body having adjacent its flat major surface a semiconductor layer portion of high electrical resistivity,
   b. introducing into the semiconductor body from its major surface to a depth less than that of the high resistance layer portion doping impurities to a concentration which when incorporated into the semiconductor body substantially reduces its resistivity, the distribution of said introduced impurities and its resultant profile substantially exactly corresponding to the negative of a non-planar profile which it is desired to shape into the body surface, said desired profile including body surface portions at plural levels,
   c. thereafter subjecting the thus-doped body to a selective electrolytic etching process which operates to remove the doped surface portions of reduced resistivity but not the high resistivity portions until said doped surface portions are substantially entirely removed leaving intact deeper high resistivity portions forming the desired non-planar profile,
   d. thereafter depositing on the non-planar profiled surface a continuous film of conductive material which extends over the different levels of the non-planar profile, and
   e. thereafter completing by deposition electrical windings and a gapped magnetic circuit of the magnetic head utilizing the film of conductive material to form conductive elements recessed in some of the deeper areas of the non-planar profile.

2. A method as claimed in claim 1 wherein after step (c) but before step (d) an electrically insulating layer is formed on the non-planar profiled surface.

3. A method as claimed in claim 1, wherein an impurity masking layer is used for preventing introduction of doping impurities into some surface portions of the high resistivity layer portions in order to selectively dope other surface portions, said impurity masking layer is removed in its entirety from the major surface prior to the selective electrolytic etching step, and the selective electrolytic etching step is carried out without any etch-resistant masking layers present on the said major surface to be profiled.

4. A method as claimed in claim 3, wherein the impurity introduction step is carried out by diffusing the impurities in the body at an elevated temperature.

5. A method as claimed in claim 3, wherein the impurity is introduced by at least two steps, one step which causes introduction of impurity forming deep doped regions and another step which causes introduction of impurity forming less deep doped regions which partially overlap with the deep doped regions, both doped regions being substantially entirely removed during the electrolytic etching step.

* * * * *

UNITED STATES PATENT AND TRADEMARK OFFICE
CERTIFICATE OF CORRECTION

PATENT NO. : 3968565
DATED : July 13, 1976
INVENTOR(S) : Theodorus Cornelis Johannes Maria Bertens et al It is certified that error appears in the above—identified patent and that said Letters Patent are hereby corrected as shown below:

Column 1, line 45, change "sadi" to -- said --.

Column 4, line 42, change "41" to -- 51 --.

Signed and Sealed this

Nineteenth Day of October 1976

[SEAL]

Attest:

RUTH C. MASON
Attesting Officer

C. MARSHALL DANN
Commissioner of Patents and Trademarks